United States Patent [19]

Eimori

[11] Patent Number: 5,610,418

[45] Date of Patent: Mar. 11, 1997

[54] SEMICONDUCTOR MEMORY DEVICE

[75] Inventor: Takahisa Eimori, Hyogo, Japan

[73] Assignee: Mitsubishi Denki Kabushiki Kaisha, Tokyo, Japan

[21] Appl. No.: 468,395

[22] Filed: Jun. 6, 1995

[30] Foreign Application Priority Data

Sep. 20, 1994 [JP] Japan .................................. 6-224996

[51] Int. Cl.⁶ ....................... H01L 27/108; H01L 29/76; H01L 29/94; H01L 31/119
[52] U.S. Cl. ..................... 257/306; 257/296; 257/300; 257/303; 257/304; 257/305; 257/311
[58] Field of Search ................................ 257/296, 300, 257/303, 304, 305, 306, 308, 311

[56] References Cited

U.S. PATENT DOCUMENTS

| | | | |
|---|---|---|---|
| 5,138,412 | 8/1992 | Hieda et al. | 257/296 |
| 5,235,199 | 8/1993 | Hamamoto et al. | 257/308 |
| 5,363,326 | 11/1994 | Nakajima | 257/296 |
| 5,373,177 | 12/1994 | Kitaoka | 257/296 |

FOREIGN PATENT DOCUMENTS 5-29579  2/1993  Japan .

OTHER PUBLICATIONS

"A 1.28 µm 2 Bit-Line Shielded Memory Cell Technology for 64 Mb DRAMs", by Y. Kawamoto et al., 1990 Symposium on VLSI Technology, pp. 13–14.

"Fabrication of Storage Capacitance-Enhanced Capacitors with a Rough Electrode", by Yoshio Hayashide et al., Japanese Journal of Applied Physics, vol. 29, 1990, pp. L2345–L2348.

"State of Art DRAM Processing Technique", Mitsubishi Electric Technical Report, vol. 63, No. 11, 1989, pp. 17–22.

Primary Examiner—Jerome Jackson, Jr.
Assistant Examiner—Carl Whitehead, Jr.
Attorney, Agent, or Firm—Lowe, Price, LeBlanc & Becker

[57] ABSTRACT

A highly integrated semiconductor memory device having large storage capacity is obtained in which dimension loss of a storage node of a capacitive element of a memory cell from the design can be suppressed and desired capacitance value is ensured. A storage node of the capacitive element of each memory cell is formed by a third conductive layer positioned above a second conductive layer serving as the bit line, on one major surface of semiconductor substrate. Storage node is electrically connected to one of source/drain regions of the transistor element of the corresponding memory cell. The storage node is arranged between a word line to which the corresponding memory cell is connected, and another word line adjacent to said word line on the side source/drain region of the transistor element of the corresponding memory cell, and crossing a bit line which is connected to the corresponding memory cell.

7 Claims, 15 Drawing Sheets

SEMICONDUCTOR MEMORY DEVICE

BACKGROUND OF THE INVENTION

1. Field of the Invention

The present invention relates to a semiconductor memory device and manufacturing method thereof and, more specifically, to a DRAM (Dynamic Random Access Memory) having a stacked type capacitor as a capacitive element of a memory cell and to a manufacturing method thereof.

2. Description of the Background Art

Thanks to development in semiconductor technology, especially in microprocessing technique, degree of integration and capacity of DRAMs have ever been improved.

As the degree of integration becomes higher and the capacity is increased, the area occupied by a capacitive element (capacitor) for storing information (charges) decreases. As a result, erroneous reading of the stored memory content, or soft error caused by destruction of stored content by an α line becomes more likely. In order to solve such a problem by increasing substantial area of the capacitive element, a stacked capacitor type memory cell, in which a storage node serving as one electrode and a cell plate serving as another electrode of the capacitive element are formed on one major surface of a semiconductor substrate has been proposed.

FIGS. 19 to 21 show a conventional typical DRAM having a stacked type capacitor. Each of a plurality of memory cells formed on one major surface of a semiconductor substrate 1 includes one transistor element (a transfer gate transistor formed by an MOS transistor) and one capacitive element (a capacitor including a storage node and a cell plate).

The transistor element of each memory cell consists of a pair of source/drain regions 3 and 4 and a gate electrode. The pair of source/drain regions 3 and 4 are formed in an element forming region (active region) of a major surface of semiconductor substrate 1 surrounded by an element isolating insulating film 2 formed on one major surface of semiconductor substrate 1. The gate electrode is formed on a channel sandwiched by the pair of source/drain regions with a gate oxide film interposed, and it is formed of a part of a corresponding word line 5.

Word lines 5 are arranged parallel to each other. Each word line 5 is electrically connected to a corresponding plurality of memory cells, that is, gate electrodes of transistor elements of the memory cells provided in the same row, in other words, it is formed physically integrated.

The capacitive element of each memory cell includes a storage node 6, and a cell plate 7 placed opposite to the surface of storage node 6 with a dielectric film 8 interposed. Storage node 6 is electrically connected to the other one of the source•drain regions 4 of the corresponding transistor element, and extending to an adjacent word line positioned on the element isolating insulating film from the gate electrode of the corresponding transistor element.

Cell plate 7 has an opening 7a on one of the source/drain regions 3 of the transistor element of the memory cell, and has a flat shape.

Bit lines 9 are arranged orthogonal to word lines 5 and parallel to each other. Each bit line 9 is electrically connected to the corresponding plurality of memory cells, that is, to one of the source/drain regions 3 of the transistor element of the memory cells provided in the same column, and formed on the cell plate with interlayer insulating layer 10 interposed.

An interlayer insulating layer 11 is formed on the bit line.

The feature of the DRAM structured as described above is that though two-dimensional area of occupation of each memory cell is small, opposing area of electrodes of the capacitive element is increased so as to ensure increased capacitance value, as the capacitive element of the memory cell is formed extending over the gate electrode of the corresponding transistor element and to the adjacent word line.

Meanwhile, since the element becomes smaller and smaller as the degree of integration becomes higher, increase of the capacitance value by arranging the storage node constituting the capacitive element of the memory cell over the bit line to increase the opposing area of electrodes of the capacitive element has been proposed (for example, see 1990 *Symposium on VLSI Technology P.* 13 or Japanese Patent Laying-Open No. 5-29579).

FIGS. 22 to 26 show a DRAM proposed based on such concept.

Each of the plurality of memory cells formed on one major surface of a semiconductor substrate 100 includes one transistor element (a transfer gate transistor consisting of an MOS transistor) and one capacitive element (a capacitor consisting of a storage node and a cell plate).

The transistor element of each memory cell includes a pair of source/drain regions 103 and 104, and a gate electrode. The pair of source/drain regions 103 and 104 are formed in an element forming region (active region) 102 (shown surrounded by one dotted line and formed obliquely in FIG. 22) on one major surface of semiconductor substrate 100, surrounded by an element isolating insulating film 101 formed on the major surface of semiconductor substrate 100. The gate electrode is formed by a part of a corresponding word line 107 which is formed on a channel 105 sandwiched by the pair of source/drain regions 103 and 104 with a gate oxide film 106 interposed.

Each word line 107 is formed by a first conductive layer on the major surface of semiconductor substrate 100 and arranged parallel to each other. Each word line 107 is electrically connected to, that is, physically integrated with, the corresponding plurality of memory cells, or the gate electrodes of transistor elements of the memory cells provided on the same row in the circuit structure.

Each bit line 108 is formed by a second conductive layer positioned above the first conductive layer forming the word line 107, on the major surface of semiconductor substrate 100. Bit lines 108 are arranged parallel to each other and orthogonal to the word lines 107. Further, each bit line 108 is electrically connected to the corresponding plurality of memory cells, that is, one of the source/drain regions 103 of the transistor elements of the memory cells provided on the same column in the circuit structure, and formed above the word line 107 with an interlayer insulating layer 109 interposed therebetween.

The capacitive element of each memory cell consists of a storage node 110 electrically connected to the other one of the source/drain regions 104 of the corresponding transistor element, and a cell plate 111 formed on and opposing to the surface of storage node 110 with a dielectric film 112 interposed.

Each storage node 110 is formed by a third conductive layer positioned above the second conductive layer forming the bit line 108, on one major surface of semiconductor substrate 100, with an interlayer insulating layer 113 interposed. Further, each storage node 110 is electrically connected to the other one of the source/drain regions 104 of the corresponding memory cell. Further, the storage node 110 is positioned between a bit line to which the corresponding memory cell is connected, and an adjacent bit line on the side of the other one of the source/drain regions 104 of the transistor element of the corresponding memory cell with respect to said bit line, and crossing the word line to which the corresponding memory cell is connected.

The cell plate 111 is formed to have a flat shape.

Referring to FIG. 22, a bit line contact 114 (denoted by a black circle) indicates an electrical connection between one of the source/drain regions 103 of the transistor element of the memory cell and bit line 108. A storage node contact 115 (denoted by a white circle) indicates an electrical contact with one of the source/drain regions 104 of the transistor element of the memory cell and the storage node 110 of the capacitive element of the memory cell.

Referring to FIG. 22, a portion (denoted by a reference numeral 116) around storage node 110 which is painted black indicates are "dimension loss" which is the difference between the design of storage node 110 and the actual finish, that is, the lost portion. The outer periphery of dimension loss 116 represents the design of storage node 110, and the inner periphery represents the outer periphery of the actually finished storage node 110.

In the DRAM structured as described above, storage node 110 of the capacitive element of the memory cell is formed by the layer above the bit line 108, and therefore large opposing area of storage node 110 and cell plate 111 can be ensured, thus large capacitance value is obtained. However, if the arrangement pitch of word line 107 is made approximately equal to the pitch of bit lines 108 in order to realize highest density of memory cells, the following problem arises.

More specifically, since storage node 110 is formed in a depressed portion between two adjacent bit lines 108, the longer side of storage node 110 is positioned on the inclined surface of interlayer insulating layer 113. Accordingly, at the time of exposure for forming a resist pattern to form storage node 110, the light reflected from the inclined surface of interlayer insulating layer 113 exposes portions inner than the design as shown in FIGS. 27 to 29, and thus the resist pattern becomes thinner. As a result, in the actual finish of storage node 110, there is the dimension loss from the design at the longer side portion.

Therefore, the capacitance value of the capacitive elements obtained is smaller than the design, which results in degradation in characteristics of the DRAM such as hold time of the stored charges in the capacitive element, and further leads to degradation in soft error characteristic.

FIG. 27 shows exposure for forming a resist pattern for storage node 110. More specifically, on the entire surface of interlayer insulating layer 113 on bit line 108, a third conductive layer 110a for forming the storage node 110 is provided. Resist 117a is applied to the third conductive layer 110a. FIG. 27 shows irradiation of resist 117a with light, using a storage node mask 118. Storage node mask 118 includes a light intercepting portion 118a which does not pass the light for forming storage node 110, and light transmitting portion 118b. Resist 117a is a positive photoresist. Hatched portion in resist 117a denotes a portion exposed by the light which has passed through the light transmitting portion 118b of mask 118. Cross hatched portion of resist 117a denotes a portion exposed by the light 119a reflected from the inclined surface of interlayer insulating layer 113 resulting from bit line 108.

FIG. 28 shows resist pattern 117 formed by development of resist 117a. Portions exposed by the light which has passed through light transmitting portion 118b of mask 118 and light 119a reflected from the inclined surface of interlayer insulating layer 113 are removed. Resist 117 left for forming storage node 110 is thinner than the width of the light intercepting portion 118a of mask 118.

FIG. 29 shows a state in which storage node 110 is formed by etching the third conductive layer 110a based on resist pattern 117. The width of storage node is approximately the same as that of resist pattern 117. However, the width of resist pattern 117 is thinner than that of light intercepting portion 118a of mask 118.

In the actual finish, there is a dimension loss in the shorter side portion of storage node 110 from the design. This is because there is strong diffraction effect of light at end portions of the shorter side of the rectangle, when resist pattern 117 is obtained from resist 117a.

Referring to FIG. 30, description will be given as to how much dimension loss results in the actual finishing of storage node 110 from the design.

The example shown in FIG. 30 is designed with the design rule of 0.25 μm, the width between word lines 107 and bit lines 108 of 0.25 μm, the width of word line 107 and bit line 108 of 0.25 μm, base pitch (space between word lines 107 and space between bit lines 108) of 0.6 μm, and the design of storage node 110 of 0.35 μm (shorter side)×0.95 μm (longer side).

In this example, the reduction x of the longer side of storage node 110 is not smaller than 0.02–0.05 μm (x≧0.02 to 0.05 μm), and the area of the dimension loss 116 was at least 20% with respect to the area of the design.

In the DRAM structured as described above, in order to prevent dimension loss at the longer side portion of storage node 110, in other words, in order to prevent influence of the light 119a reflected from the inclined surface of interlayer insulating layer 113 on the longer side portion of storage node 110, the longer side of storage node 110 may be designed to rest against bit line 108.

However, if it is designed with the design rule of 0.25 μm, the space of resist pattern 117 positioned between longer sides of adjacent storage node 110 becomes narrower than the width of the bit line. Therefore, at the time of development, resists 117a positioned between longer sides of adjacent storage node 110 are not resolved but connected. As a result, there arises a problem that longer sides of adjacent storage nodes 110 are connected.

SUMMARY OF THE INVENTION

An object of the present invention is to provide a structure of a semiconductor memory device, especially a structure of a DRAM, suitable for higher degree of integration and larger capacity.

Another object of the present invention is to provide a structure of a DRAM which can reduce dimension loss of the storage node of a capacitive element in a memory cell from the design and ensure desired capacitance value, even when the degree of integration and capacity are increased.

Another object of the present invention is to further increase capacitance value of a capacitive element of a memory cell in a structure of a DRAM having a stacked type capacitor.

According to one aspect of the present invention, the semiconductor memory device includes a plurality of memory cells each consisting of one transistor element and one capacitive element, and a plurality of bit lines electrically connected to one of source/drain regions of a corresponding one transistor element of the plurality of memory cells, wherein a storage node of a capacitive element of each memory cell is formed by a third conductive layer positioned above a second conductive layer forming the bit line, on one major surface of the semiconductor substrate, the storage node is electrically connected to the other one of the source/drain regions of the transistor element of the corresponding memory cell, and arranged between adjacent two word lines and crossing a bit line, with its longer side being parallel to the word lines and its shorter side being parallel to the bit lines.

According to another aspect of the present invention, the semiconductor memory device includes a plurality of memory cells each consisting of one transistor element and one capacitive element, and a plurality of bit lines electrically connected to one of source/drain regions of corresponding one of the transistor elements of the plurality of memory cells, wherein a storage node of the capacitive element of each memory cell is formed by a third conductive layer positioned above a second conductive layer forming the bit line, on one major surface of the semiconductor substrate, the storage node is electrically connected to the other one of the source/drain regions of the transistor element of the corresponding memory cell, and it is arranged between a word line to which the corresponding memory cell is connected, and a word line adjacent to said word line on the side of said the other one of the source/drain regions of the transistor element of the corresponding memory cell, and crossing that bit line which is connected to the corresponding memory cell.

According to a still further aspect of the present invention, in the semiconductor memory device, shorter side portion of the storage node constituting one electrode of the capacitive element of the memory cell is extending over a bit line which is adjacent to that bit line which is connected to the corresponding memory cell.

According to the method of manufacturing a semiconductor memory device in accordance with the present invention, the method of manufacturing a storage node constituting one electrode of a capacitive element of each memory cell in a semiconductor memory device having a plurality of memory cells each consisting of one transistor element and one capacitive element and a plurality of bit lines electrically connected to one of source/drain regions of a corresponding one of transistor elements of the plurality of memory cells includes the following steps:

the step of forming a third conductive layer which is electrically connected to the other one of the source/drain regions of the transistor element of the memory cell, above a bit line with an interlayer insulating layer interposed;

the step of forming a photoresist layer on the third conductive layer;

the step of exposing the photoresist layer by using a mask which has such a light intercepting portion as follows: the light intercepting portion corresponds to each storage node, positioned between a word line to which a corresponding memory cell is connected and another word line which is adjacent to said word line on the side of said the other one of the source/drain regions of the transistor element of the corresponding memory cell, and extending from a connection portion of the third conductive layer which is electrically connected to said the other one of the source/drain regions of the transistor element of the corresponding memory cell, crossing the bit line to which the corresponding memory cell is connected, and over another bit line which is adjacent to said bit line;

the step of forming a resist pattern by developing the exposed photoresist layer, leaving the un-exposed portion; and the step of forming a storage node by etching the third conductive layer, by using the resist pattern.

According to one aspect of the present invention, since the storage node of the capacitive element of the memory cell is formed by a layer above the bit line, the large opposing area between the storage node and the cell plate can be ensured. Further, since the longer side portion of the storage node is arranged parallel to the word lines, dimension loss from the design of the storage node can be reduced.

According to another aspect of the present invention, the storage node of the capacitive element of the memory cell is formed by a layer which is above the bit line, and therefore large opposing area between the storage node and the cell plate can be ensured. Further, since the storage node is arranged between a word line to which the corresponding memory cell is connected and another word line which is adjacent to said word line on the side of said the other one of the source/drain regions of the transistor element of the corresponding memory cell and arranged crossing the bit line which is connected to the corresponding memory cell, dimension loss from the design of the storage node can be reduced.

According to a further aspect of the present invention, the shorter side portion of the storage node is formed extending over a bit line which is adjacent to that bit line which is connected to the corresponding memory cell, and therefore capacitance value of the capacitive element of the memory cell can be increased.

In the method of manufacturing of the present invention, the photoresist layer for forming the storage node is exposed, corresponding to each storage node, by using a mask having such a light intercepting portion that corresponds to a portion of the third conductive layer which is positioned between a word line to which the corresponding memory cell is connected and another word line which is adjacent to said word line on the side of said the other one of the source/drain regions of the transistor element of the corresponding memory cell, extending from a connection portion of the third conductive layer connected electrically to said the other source/drain regions of the transistor element of the corresponding memory cell, crossing over the bit line to which the corresponding memory cell is connected and resting on the bit line adjacent to said bit line, and therefore dimension loss from the design of the storage node can be reduced.

According to the present invention, a structure of a semiconductor memory device which is suitable for higher degree of integration and increased capacity can be obtained. Further, even when the degree of integration and storage capacity are increased, dimension loss from the design of the storage node of the capacitive element of the memory cell can be reduced, and therefore desired capacitance value can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
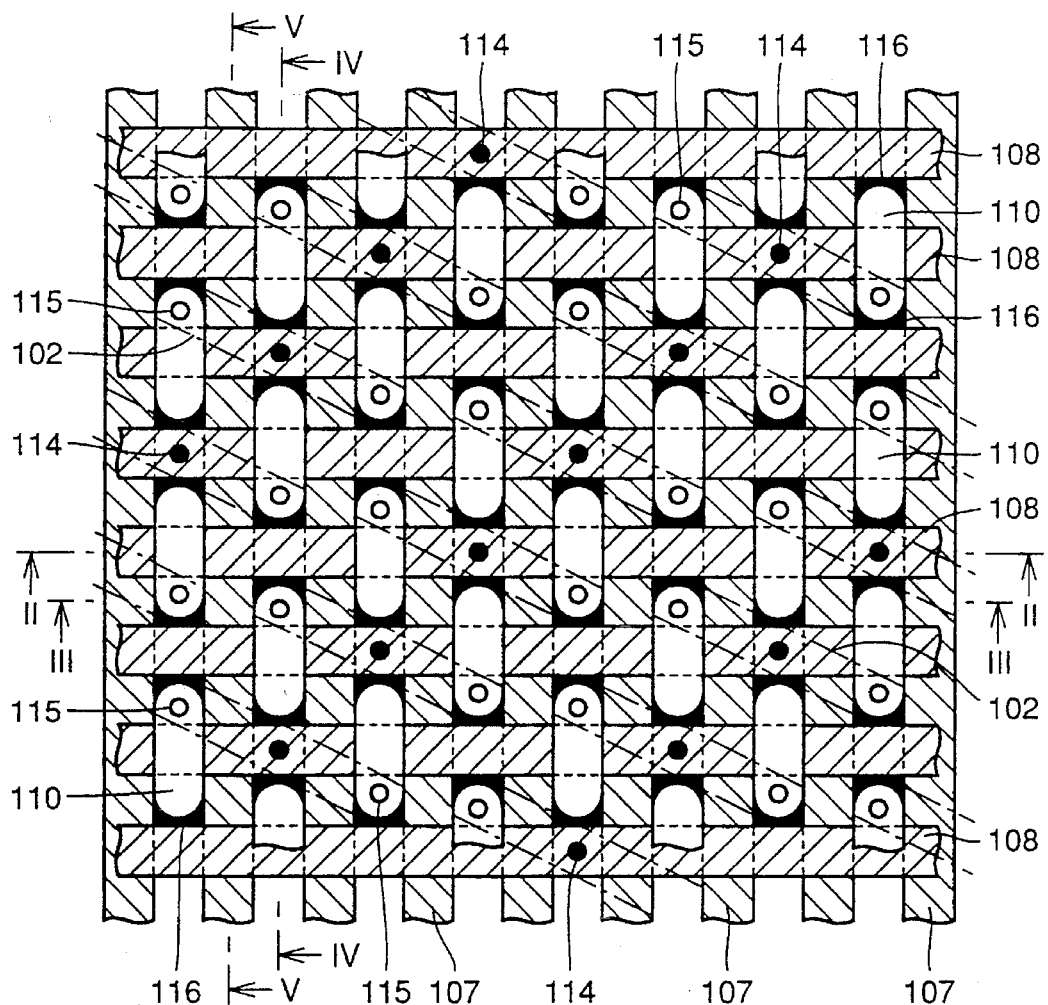
FIG. 1 is a plan view showing a first embodiment of the present invention in which storage node 110 is placed on the uppermost portion.
Figure 2:
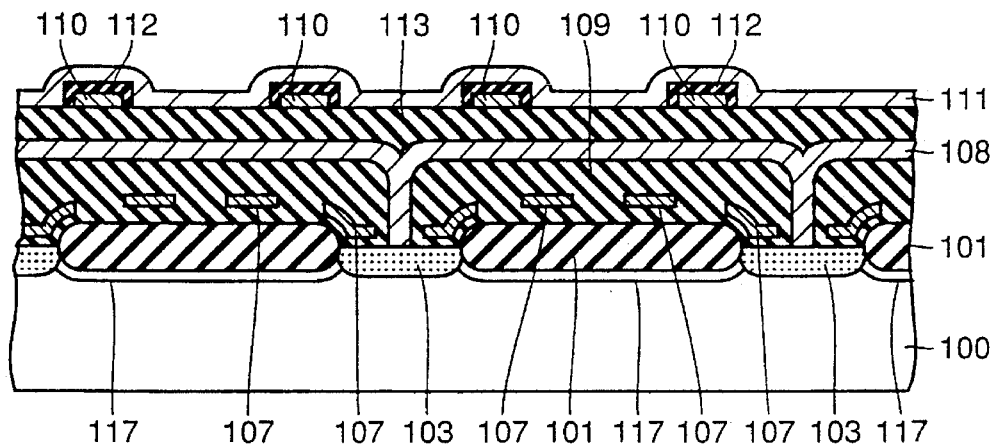
FIG. 2 is a cross section taken along the line II—II of FIG. 1 showing the first embodiment of the present invention.

The first embodiment of the present invention will be described with reference to FIGS. 1 to 5. Referring to the figure, a semiconductor substrate 100 is, for example, of a P type silicon substrate. An element isolating insulating film 101 is formed of a silicon oxide film formed on one major surface of semiconductor substrate 100, and it is formed to surround an element forming region (active region) 102 (surrounded by one dotted line in FIG. 1 and formed orthogonally) on the said major surface of the semiconductor substrate 100 for electrically insulating transistor elements formed between the element forming regions 102.

A pair of source/drain regions 103 and 104 of a transistor element of a memory cell are formed in each element forming region 102 at semiconductor substrate 100, and these regions are formed, for example, by N type diffusion regions (impurity regions) formed by ion implantation of N type impurity. One of the source/drain regions 103 also serve as one of the source/drain regions of another memory cell. The pair of source/drain regions 103 and 104 may be formed in a well region formed at one major surface of semiconductor substrate 100.

A plurality of word lines 107 are formed on the major surface of the semiconductor substrate 100 by a first conductive layer consisting of metal (high melting point metal) silicide such as polycrystalline silicon, tungsten silicide (WSi) or titanium silicide ($TiSi_2$), or a metal such as tungsten (W) or aluminum (Al), and arranged parallel to each other. The plurality of word lines 107 include gate electrodes of transistor elements which are electrically connected (in other words, physically integrated) to the gate electrodes of transistor elements of the corresponding plurality of memory cells (that is, memory cells provided on the same row viewed from the circuit structure). The gate electrode portion is formed on a channel 105 sandwiched by the pair of source/drain regions 103 and 104 of the corresponding transistor element with a gate oxide film 106 interposed. The gate electrode and the pair of source/drain regions 103 and 104 constitute one transistor element (transfer gate transistor consisting of MOS transistor (field effect transistor)) of the memory cell.

A plurality of bit lines 108 are formed of a second conductive layer consisting of metal (high melting point metal) silicide such as polycrystalline silicon, tungsten silicide (WSi) or titanium silicide ($TiSi_2$), or a metal such as tungsten (W) or aluminum (Al), which is positioned above the first conductive layer forming the aforementioned word lines 107, on the major surface of the semiconductor substrate, and arranged parallel to each other. The plurality of bit lines 108 cross the word lines 107, and in the first embodiment, the word lines and the bit lines are arranged orthogonal to each other. Further, the plurality of bit lines 108 are electrically connected to one of the source/drain regions 103 of the transistor elements of the corresponding plurality of memory cells (that is, memory cells provided on the same column viewed from the circuit structure) at bit line contacts 114 (denoted by black circles in FIG. 1), and the bit lines are formed on word lines 107 with an interlayer insulating layer 109 interposed.

Storage node 110 is formed by a third conductive layer consisting of polycrystalline silicon, or a metal such as tungsten (W), platinum (Pt) or aluminum (Al), which is positioned above the second conductive layer serving as the bit line 108, on the major surface of the semiconductor substrate 100, with an interlayer insulating layer 113 positioned therebetween. Each storage node 110 is electrically connected to the other one of the source/drain regions 104 of the transistor element of the corresponding memory cell at a storage node contact 115 (denoted by a white circle in FIG. 1). Each storage node 110 is arranged between two adjacent word lines 107, and in the first embodiment, between word line 107 to which the corresponding memory cell is connected, and another word line 107 which is adjacent to said word line 107 on the side of said the other of the source/drain regions 104 of the transistor element of the corresponding memory cell, with its longer side being parallel to the word line 107 and its shorter side being parallel to the bit lines 108. Each storage node 110 is arranged over bit line 108, and in this first embodiment, placed crossing over the bit line 108 to which the corresponding memory cell is connected.

Cell plate 111 is positioned opposing to the surface of each of said storage nodes 110 with a dielectric film 112 interposed, and it is a flat shaped cell plate formed of polycrystalline silicon or a metal such as tungsten (W), platinum (Pt) or aluminum (Al). The cell plate and each storage node 110 constitute one capacitive element (capacitor) of the memory cell. The dielectric film 112 is a composite film of silicon oxide film/silicon nitride film ($SiO_2$/SiN), or a highly dielectric film such as a PZT film or a BST film.

A channel stopper region 117 is formed by ion implantation of an impurity having the same conductivity type as the semiconductor substrate 100, immediately below the element isolating insulating film 101.

Referring to FIG. 1, black portion (denoted by the reference numeral 116) near the shorter side portion of storage node 110 represents the dimension loss in the actual finishing, that is, portion lost from the design of storage node 110. The outer periphery of dimension loss 116 denotes the design at the shorter side portion of storage node 110, and inner periphery of dimension loss 116 denotes the outer periphery of the shorter side portion of the actually finished storage node 110.

A method of manufacturing the storage node constituting one electrode of a capacitive element of each memory cell of the DRAM is as follows.

Figure 3:
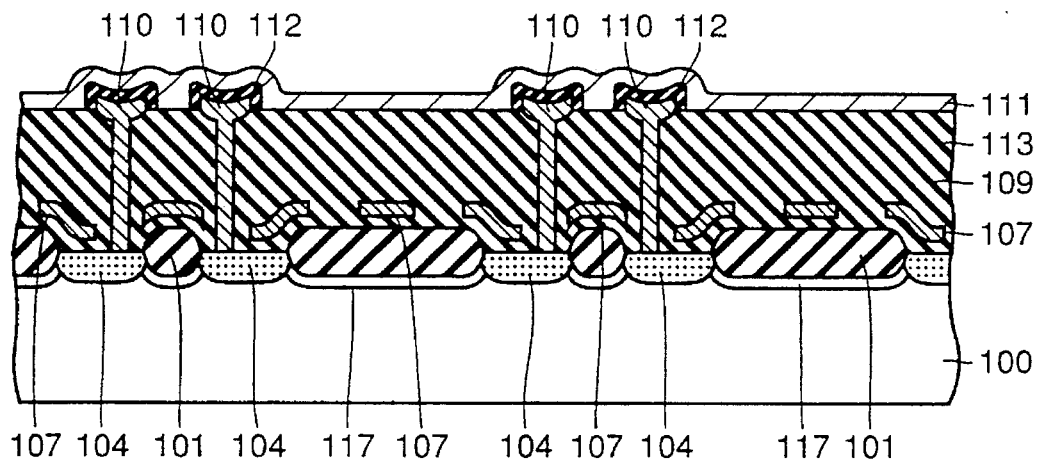
FIG. 3 is a cross section taken along the line III—III of FIG. 1 showing the first embodiment of the present invention.
Figure 4:
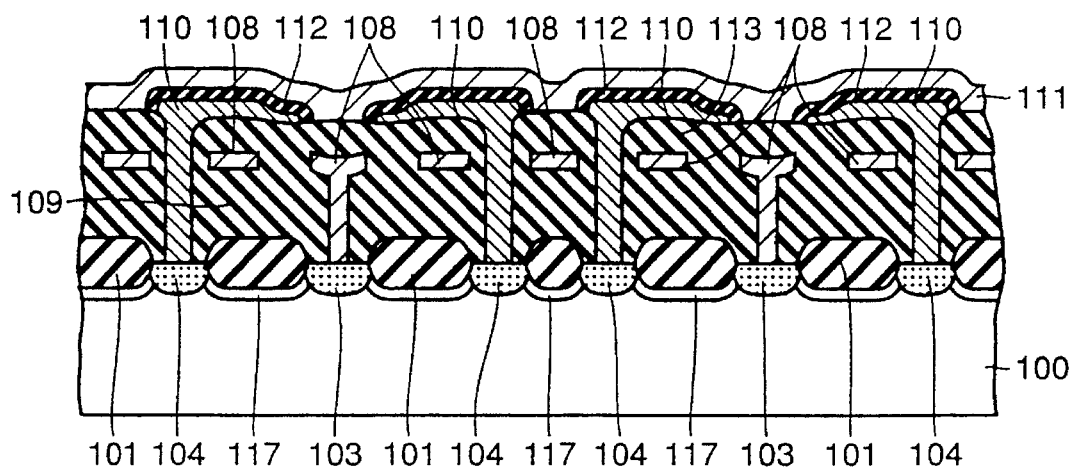
FIG. 4 is a cross section taken along the line IV—IV of FIG. 1 showing the first embodiment of the present invention.
Figure 5:
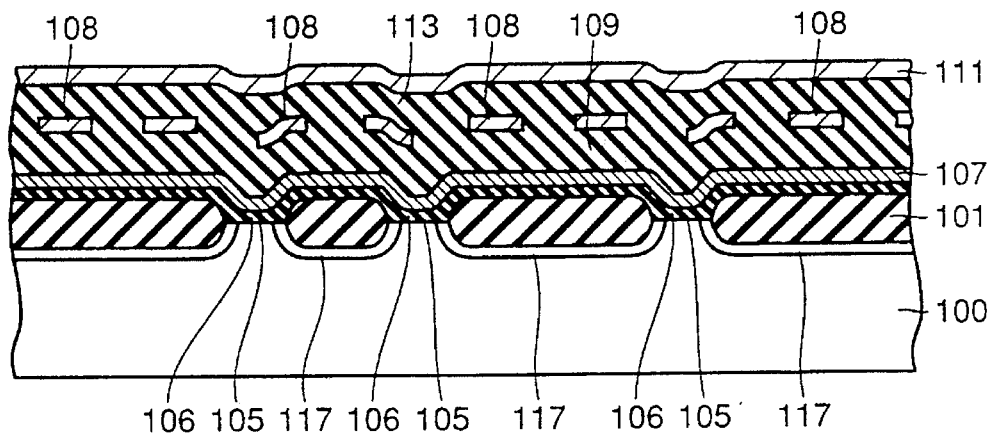
FIG. 5 is a cross section taken along the line V—V of FIG. 1 showing the first embodiment of the present invention.

First, on the entire surface of interlayer insulating layer 113 on bit line 108, a third conductive layer for forming the storage node 110 is provided. The third conductive layer is electrically connected to the other one of the source/drain regions 104 of the transistor element of the memory cell through a contact hole provided in interlayer insulating layers 113 and 109, at a storage node contact 115 (FIG. 3).

Alternatively, a conductor such as metal may be filled in the contact hole provided in interlayer insulating layers 113 and 109, and then a conductive layer may be formed on the entire surface of interlayer insulating layer 113 so as to provide the third conductive layer.

Then, a positive photoresist is applied to the third conductive layer, light is directed to the thus formed photoresist layer by using a storage node mask, and the photoresist layer is exposed.

The storage node mask has a light intercepting portion which does not transmit light for forming storage node 110, and a light transmitting portion.

The shape of each light intercepting portion of the storage node mask is designed such that the portions not irradiated with light of photoresist layer correspond to the storage nodes 110. Namely, it is positioned between a word line 107 to which the corresponding memory cell is connected and another word line 107 which is adjacent to said word line on the side of the other one of the source/drain regions 104 of the transistor element of the corresponding memory cell, and extends from a connection portion (storage node contact 115) of the third conductive layer electrically connected to the other one of the source/drain regions 104 of the transistor element of the corresponding memory cell, crossing over a bit line 108 to which the corresponding memory cell is connected, and is positioned between two bit lines 108 adjacent to said bit line. The shape is a rectangle having its shorter sides defined by a space between two adjacent word lines, and its longer sides defined by a space between two bit lines 108 on both sides of the bit line 108 to which the corresponding memory cell is connected.

At this time, light is directed to the photoresist layer such that the position at which the longer side of storage node 110 exists corresponds to a side of word line 107. Since there are an interlayer insulating layer 109 provided between bit line 108 and word line 107 and another interlayer insulating layer 113 provided between bit line 108 and storage node 110, between the word line 107 and storage node 110, there is not a stepped portion, or inclined surface in the direction orthogonal to the word line 107, on the side of word line 107. Therefore, there is not a depressed portion between two word lines 107. In other word, there is fairly flat surface in a direction orthogonal to the word line 107.

Therefore, unlike the prior art, in the photoresist layer, the portion where the longer side of storage node 110 is positioned is not exposed inner than the designed by the reflected light, and the photoresist layer is exposed approximately as designed.

The photoresist layer at which the shorter side of storage node 110 is positioned is exposed inner than the design, because the diffraction effect of light at end portions on the shorter side is considerably strong.

Figure 27:
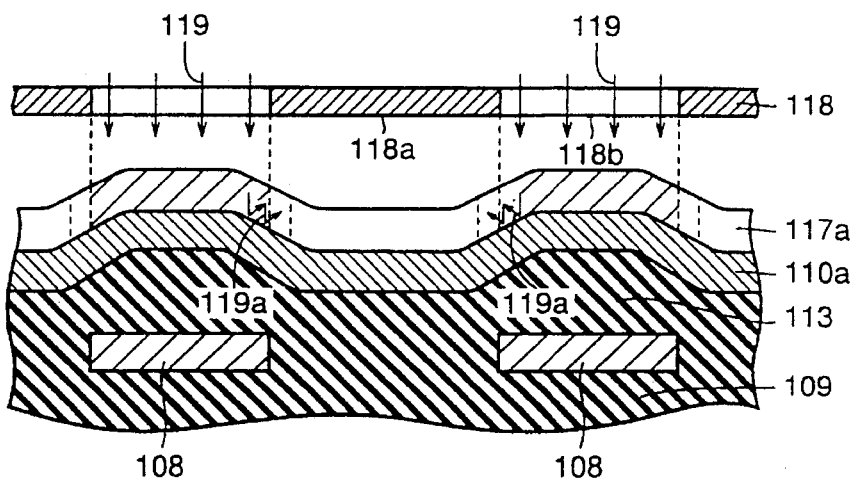
FIGS. 27 to 29 are cross sections taken along the line G—G of FIG. 30 showing the steps of manufacturing the storage node 110 of the DRAM.
Figure 28:
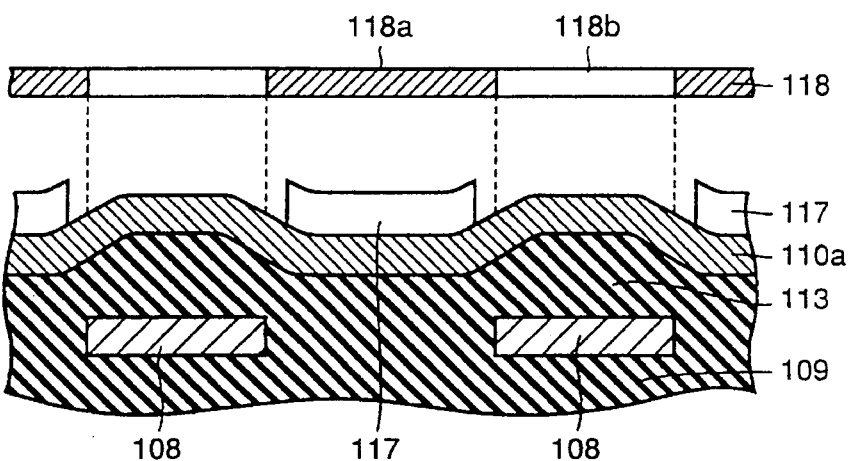
Figure 29:
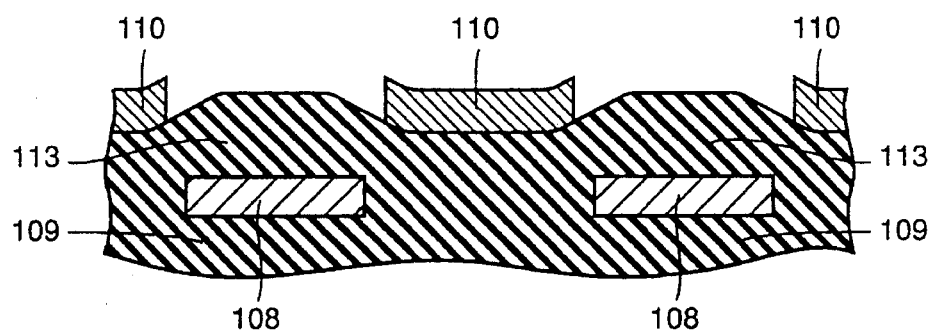

Thereafter, the exposed photoresist layer is developed, and a resist pattern is formed in which exposed portions are left. At this time, portions exposed by the light which has transmitted through light transmitting portion 118b (FIG. 27) of mask 118 and portions exposed by the diffraction effect of light at end portions on the shorter side are removed, and thus the resist pattern corresponding to storage node 110 has longer sides processed approximately as designed, and shorter sides processed inner than the design, and thus the pattern has elliptical shape.

Thereafter, using the resist pattern, the third conductive layer is etched to form storage node 110. At this time, the shape of storage node 110 is approximately the same as the shape of the resist pattern.

Thereafter, the resist pattern is removed, and dielectric film 112 and cell plate 111 of the capacitive element of the memory cell are formed.

Figure 6:
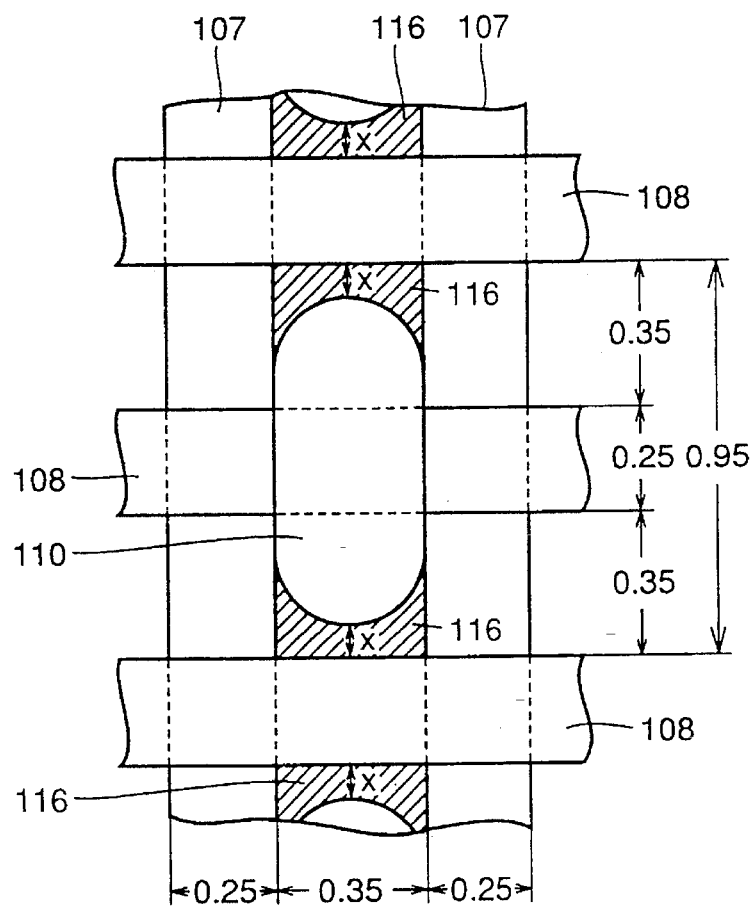
FIG. 6 is an enlarged plan view showing storage node 110 of the first embodiment of the present invention.

Referring to FIG. 6, how much dimension loss was caused from the design in the actual finishing of storage node 110 will be described.

In the example shown in FIG. 6, the design rule was 0.25 μm, the width of word line 107 and bit line 108 was 0.25 μm, the base pitch (space between word lines 107 and space between bit lines 108) was 0.6 μm, and the design of storage node 110 was 0.35 μm (shorter side)×0.95 μm (longer side).

In this example, there is hardly a reduction in the longer side portion of storage node 110, and the reduction ×at the shorter side portion of storage node 110 was at least 0.02 to 0.05 μm, which was approximately the same as the prior art.

Figure 30:
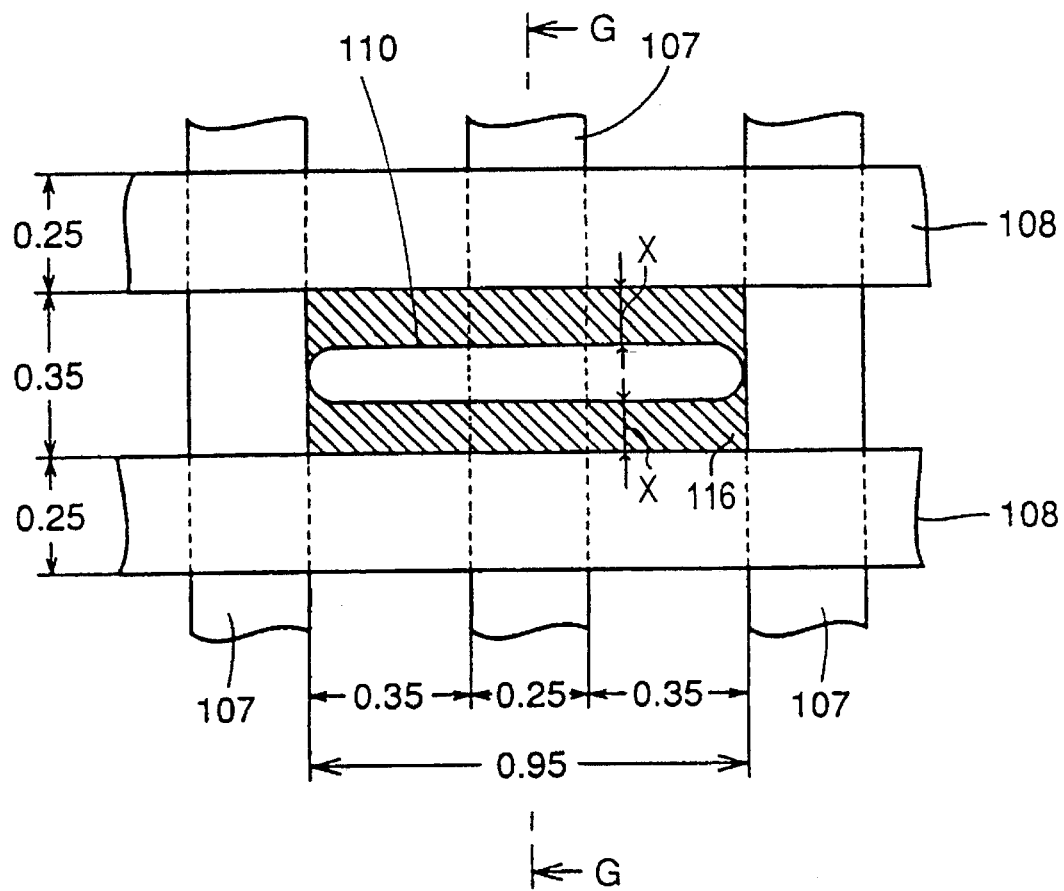
FIG. 30 is a plan view showing, in enlargement, storage node 110 of the DRAM shown in FIG. 22.

As is apparent from the comparison between FIG. 6 and FIG. 30 shown as the prior art example, according to the first embodiment, there is hardly a dimension loss at the longer side portion of storage node 110. With the same design rule, the surface area of storage node 110 of the first embodiment is larger than that of storage node 110 of the prior art example.

As a result, even when the degree of integration and storage capacity are increased, the dimension loss of the storage node of the capacitive element of the memory cell from the design can be reduced, and thus a highly integrated semiconductor memory device having large storage capacity in which desired capacitance value is ensured, can be obtained.

Second Embodiment

Figure 7:
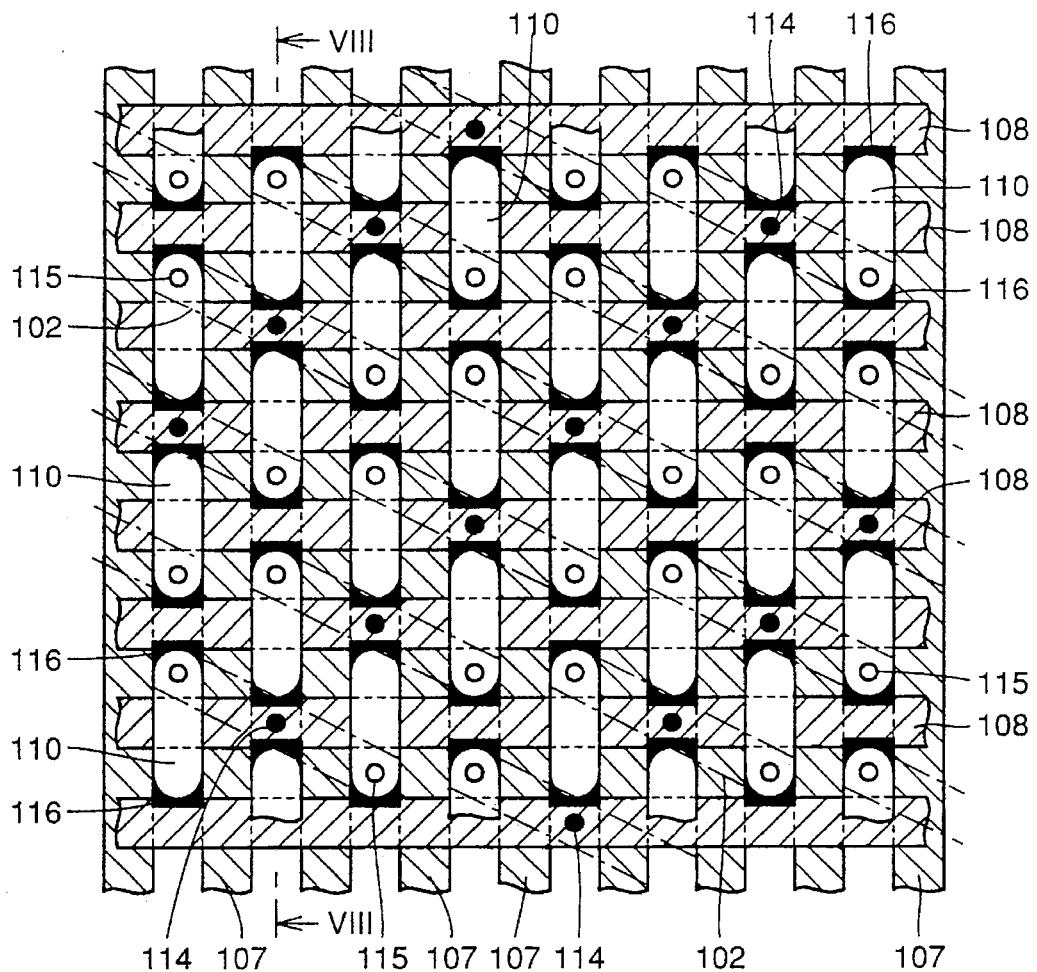
FIG. 7 is a plan view showing a second embodiment of the present invention in which storage node 110 is placed on the uppermost portion.
Figure 8:
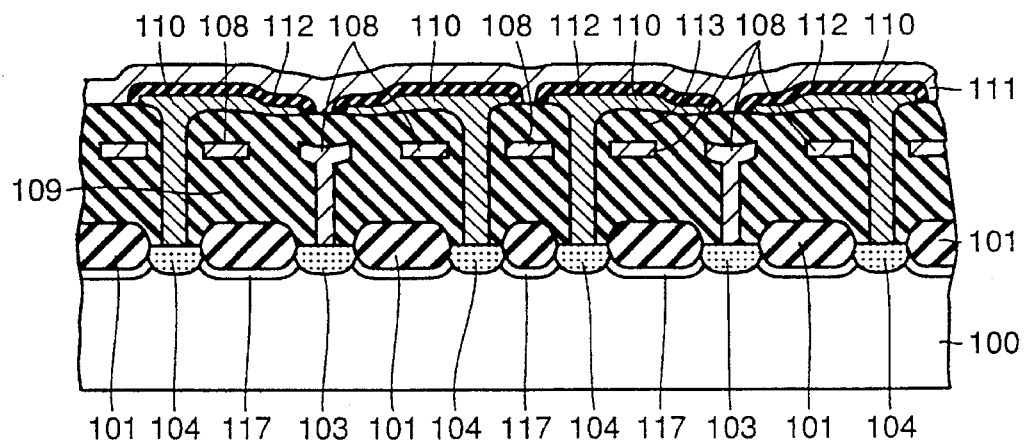
FIG. 8 is a cross section taken along the line VIII—VIII of FIG. 7 showing the second embodiment of the present invention.

FIGS. 7 and 8 show the second embodiment of the present invention. As compared with the first embodiment, in the second embodiment, the shorter side portion of storage node 110 of the capacitive element of the memory cell rests on a bit line 108 which is adjacent to that bit line 108 to which the corresponding memory cell is connected. Other than this point, this embodiment is the same as the first one. Figures corresponding to cross sections taken along the lines II—II (FIG. 2), III—III (FIG. 3) and V—V (FIG. 5) of FIG. 1 of the first embodiment show similar structures in the second embodiment.

In manufacturing the storage node, in the second embodiment, the design of each light intercepting portion of the storage node mask is as follows, as compared with the first embodiment.

More specifically, the shape of each light intercepting portion of the storage node mask is designed such that a portion not irradiated with light of photoresist layer corresponds to each storage node 110 and positioned between a word line 107 to which the corresponding memory cell is connected and another word line 107 adjacent to said word line on the side of the other one of the source/drain regions 104 of the transistor element of the corresponding memory cell, and extends from a connection portion (storage node contact 115) of the third conductive layer electrically connected to the other one of the source/drain regions 104 of the transistor element of the corresponding memory cell, crossing over a bit line 108 to which the corresponding memory cell is connected, to a position resting on two bit lines 108 on both sides of the said bit line. Its shape is a rectangle having its shorter side defined by the space between adjacent two word lines, and the longer side being wider than the space between two bit lines 108 on both sides of the bit line 108 to which the corresponding memory cell is connected.

Figure 9:
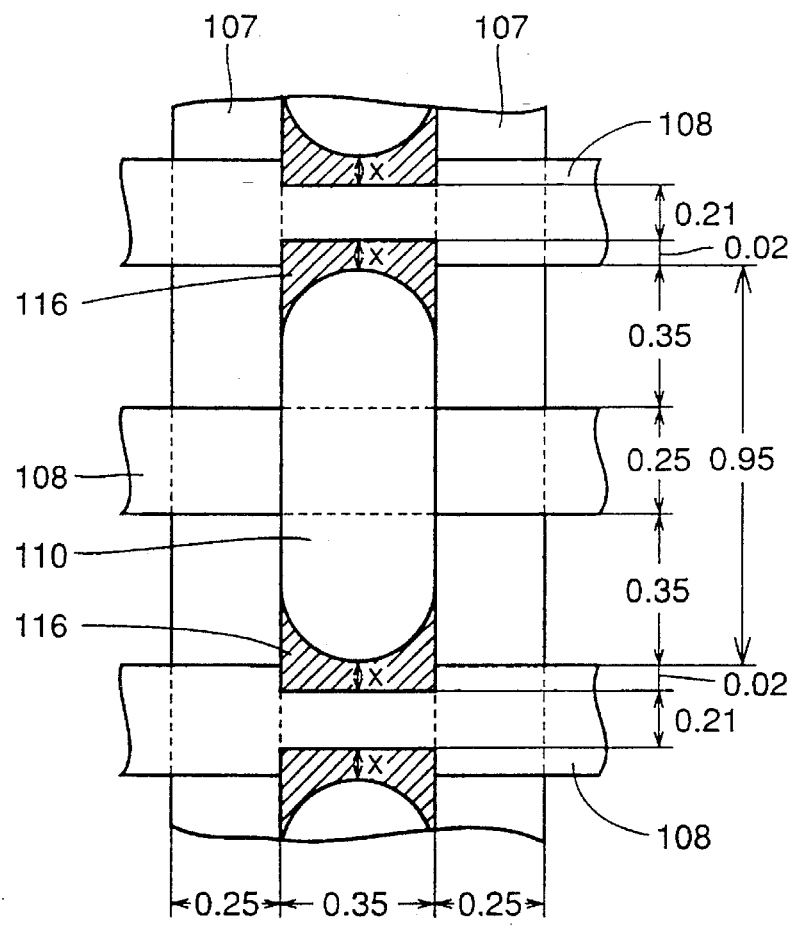
FIG. 9 is an enlarged plan view showing storage node 110 in accordance with the second embodiment of the present invention.
Figure 10:
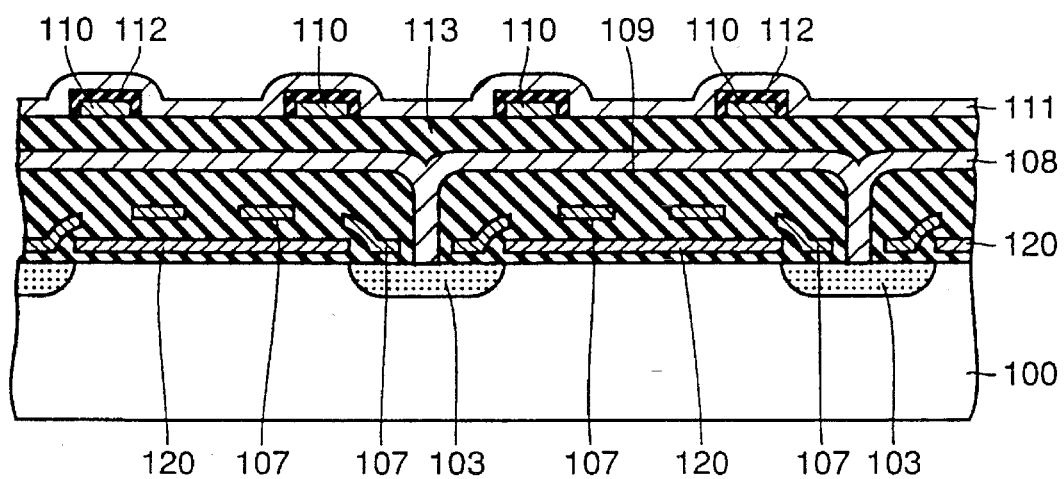
FIG. 10 corresponds to FIG. 2, and shows a third embodiment of the present invention.
Figure 11:
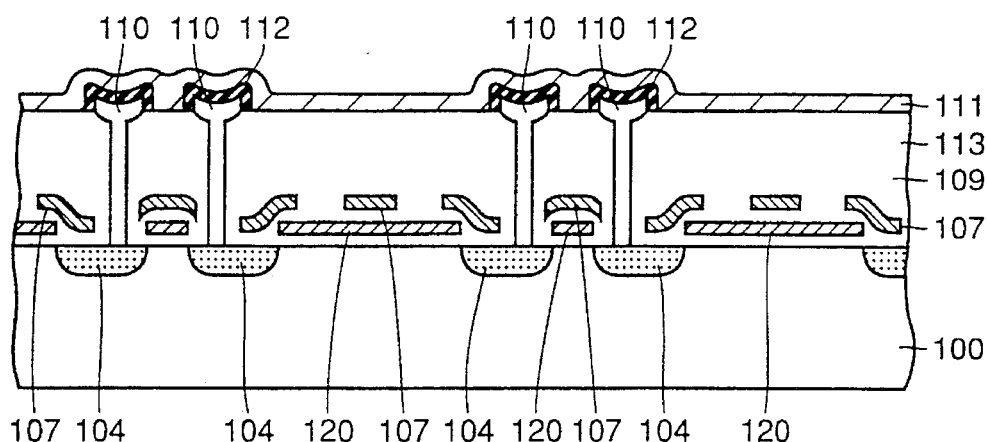
FIG. 11 corresponds to FIG. 3, and shows the third embodiment of the present invention.
Figure 12:
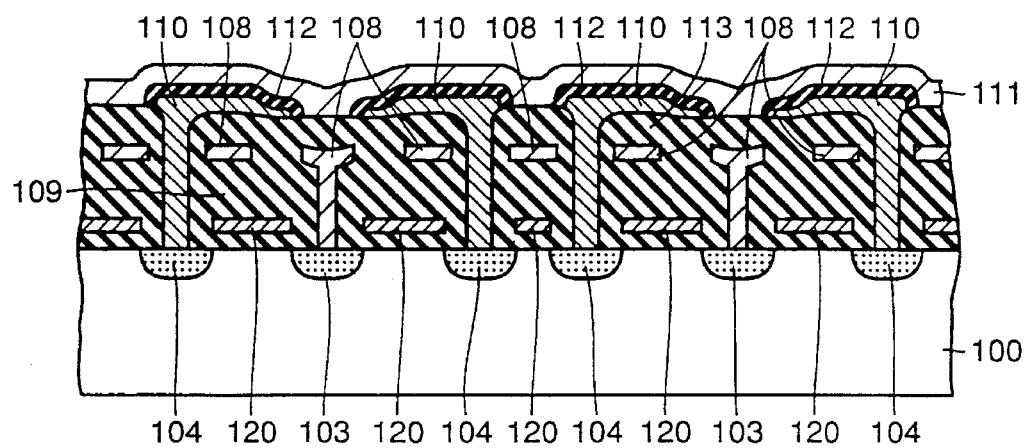
FIG. 12 corresponds to FIG. 4, and shows the third embodiment of the present invention.
Figure 13:
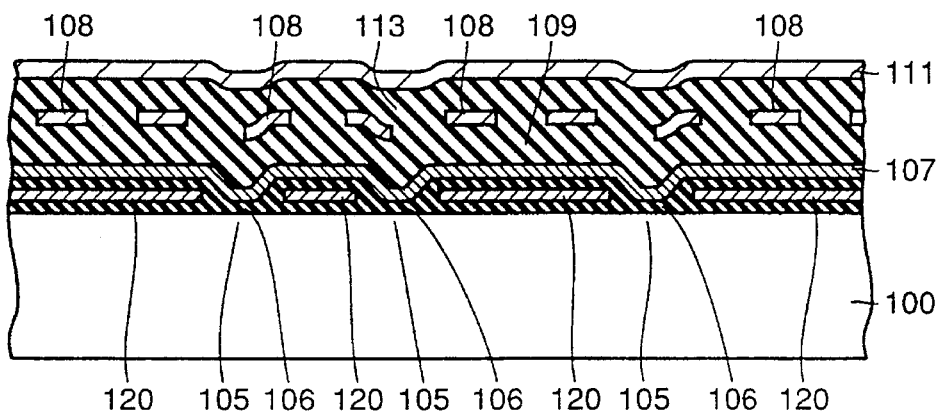
FIG. 13 corresponds to FIG. 5, and shows the third embodiment of the present invention.

In the DRAM structured as described above, when it is designed with the design rule being 0.25 μm, the length of that portion of storage node 110 which is resting on bit line 108 being 0.02 μm, and the space between shorter sides of adjacent storage nodes 110 being 0.21 μm, a storage node 110 such as shown in FIG. 9 is actually finished. As is apparent from the comparison between FIG. 9 and FIG. 6 showing the first embodiment, the capacitance value of the capacitive element becomes larger than that of the first embodiment, as the length along the longer side becomes longer.

In this second embodiment, the design corresponding to the space between shorter sides of two storage nodes 110 next to each other on the shorter side becomes narrower than the design rule (in the example of FIG. 9, 0.25 μm). However, two storage nodes were not connected but isolated from each other at the shorter sides. The following may be the reason why the storage nodes could be formed well.

When a resist film for forming storage node 110 is to be left as a rectangular pattern by photolithography, end portions of the rectangle to be left recess inside because of diffraction effects of light, light intensity, photosensitivity of the resist film and so on, and thus the shape becomes elliptical. Therefore, even when the space between shorter sides of rectangles adjacent to each other at the shorter side is shorter than the design rule, the resist film can be well resolved with the shorter sides of rectangular patterns not connected to each other.

Using this well resolved resist pattern, the third conductive layer is etched and the storage node 110 is obtained. Therefore, two storage nodes 110 are not connected at the shorter sides, and the storage nodes can be formed well.

Third Embodiment

FIGS. 10 to 13 show the third embodiment of the present invention. In the first embodiment, an element isolating insulating film of silicon oxide is formed on one major surface of semiconductor substrate 100 in order to electrically insulate element forming regions 102 from each other. By contrast, in the third embodiment, an element isolating conductive layer 120 is provided by a fourth conductive layer positioned below the first conductive layer for forming the word line, on one major surface of semiconductor substrate 100, to cover element forming regions 102. A prescribed potential is applied to the element isolating conductive layer 120. Namely, this embodiment is the same as the first embodiment except that field shield is employed.

In the DRAM structured in this manner, the same effect as in the first embodiment can be obtained. In addition, even if in a highly integrated DRAM in which steps and end portions derived from field shield are steep, dimension loss of the surface area of the storage node 110 can be reduced.

The field shield of the third embodiment may also be applied to the second embodiment.

Fourth Embodiment

Figure 14:
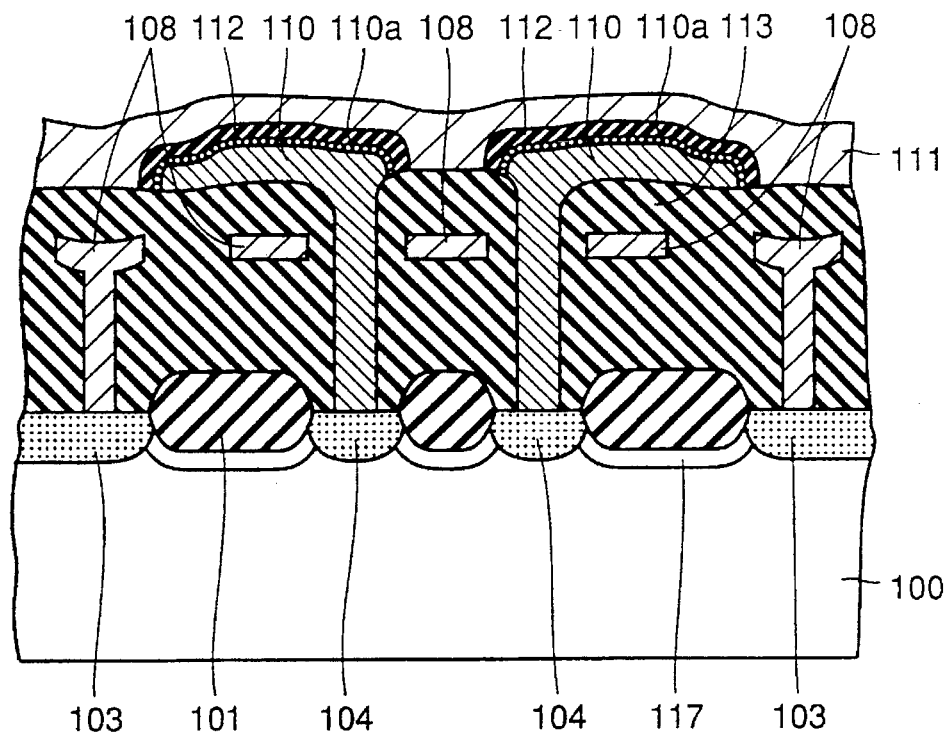
FIG. 14 is a cross section taken along the line IV—IV of FIG. 1, showing, in enlargement, main portion of a fourth embodiment of the present invention.
Figure 15:
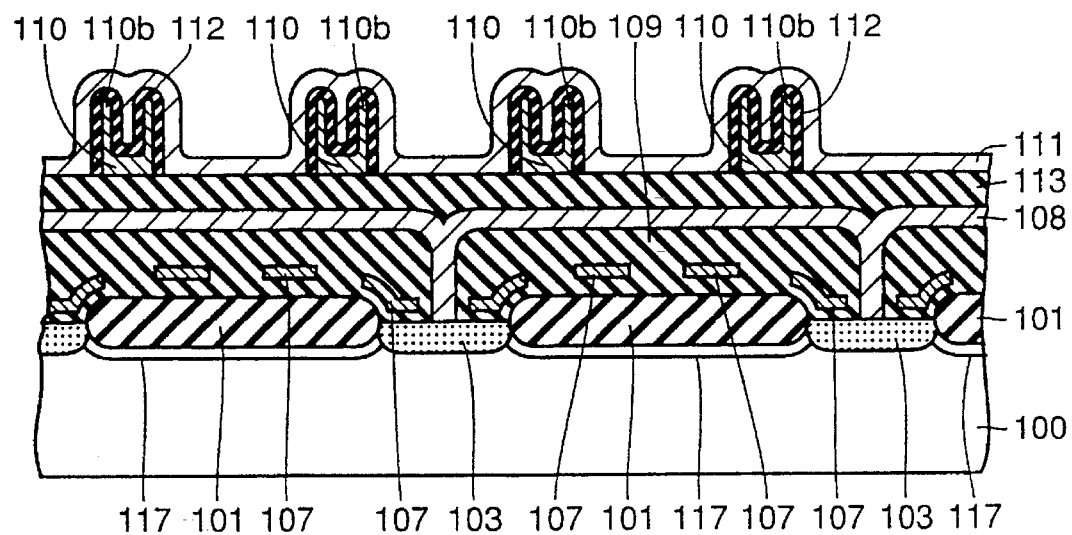
FIG. 15 corresponds to FIG. 2, and shows a fifth embodiment of the present invention.
Figure 16:
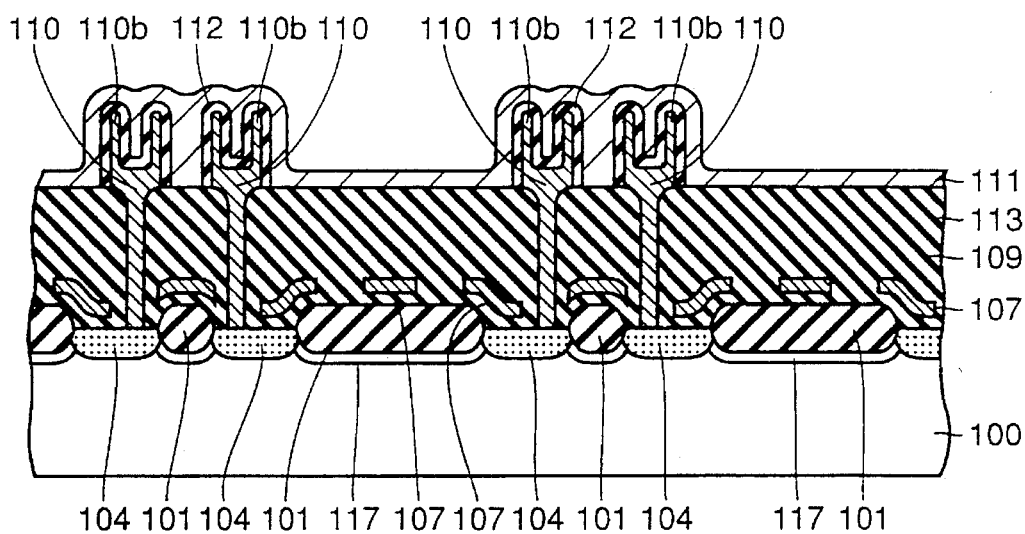
FIG. 16 corresponds to FIG. 3, and shows the fifth embodiment of the present invention.
Figure 17:
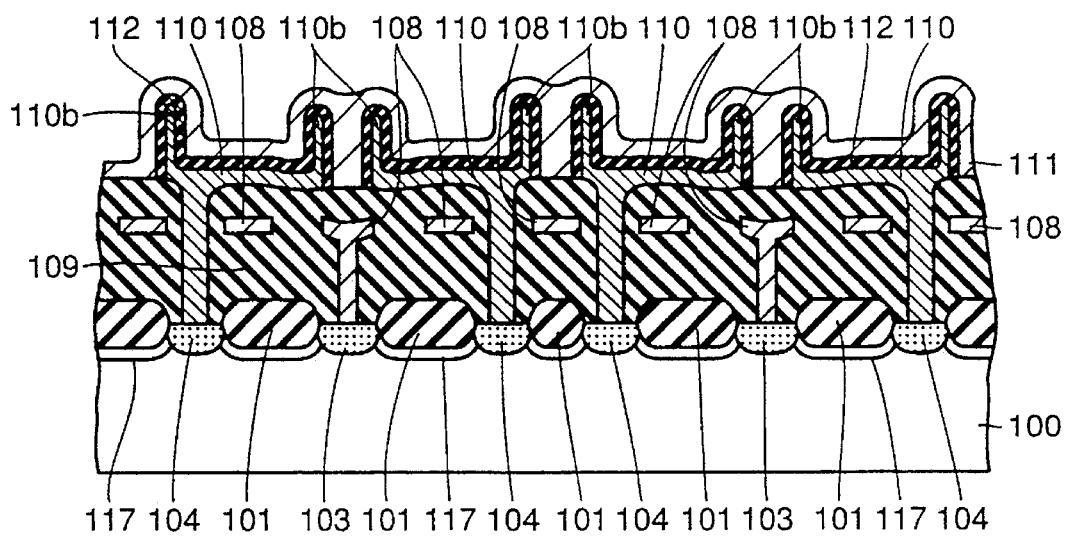
FIG. 17 corresponds to FIG. 4, and shows the fifth embodiment of the present invention.
Figure 18:
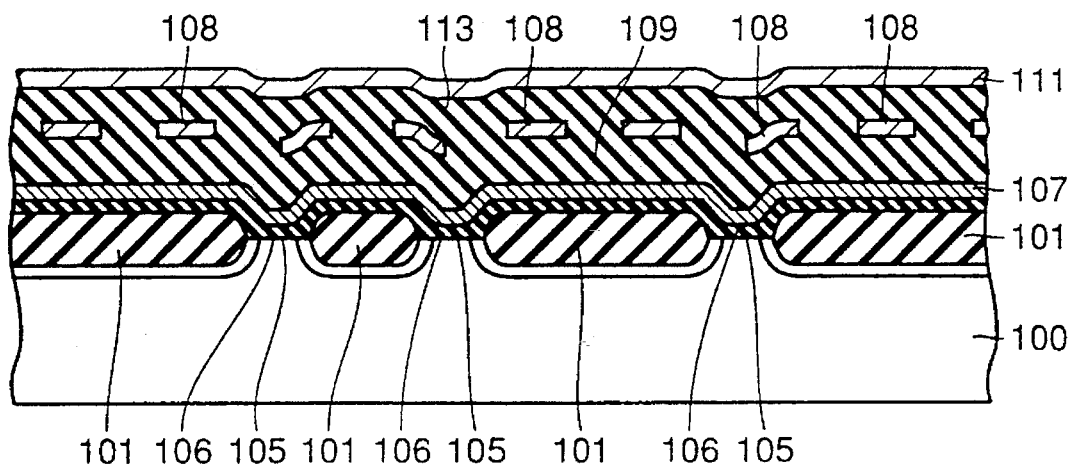
FIG. 18 corresponds to FIG. 5, and shows the fifth embodiment of the present invention.
Figure 19:
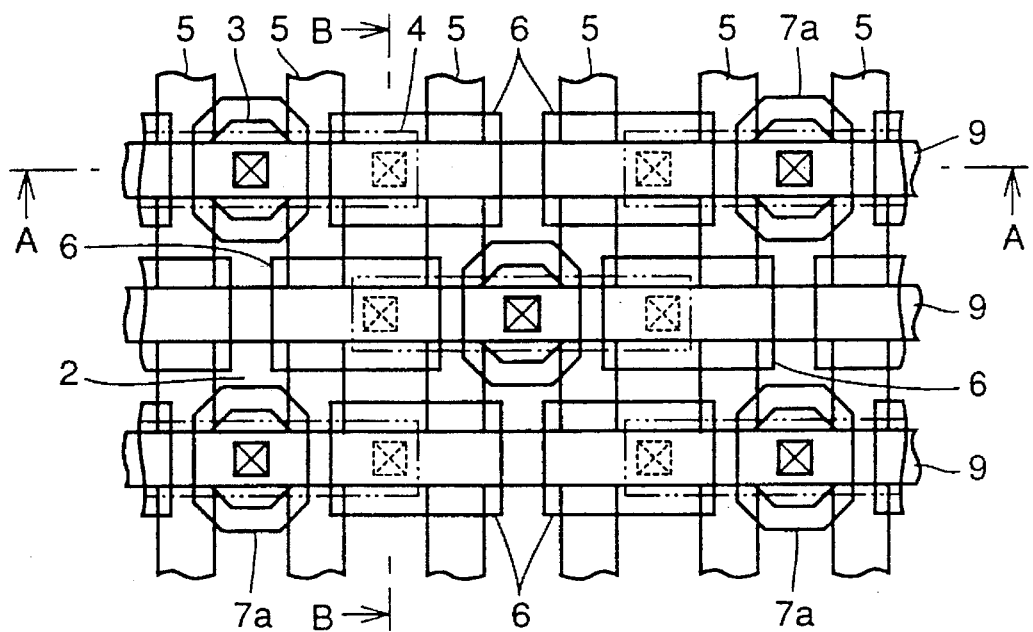
FIG. 19 is a plan view showing a conventional DRAM.
Figure 20:
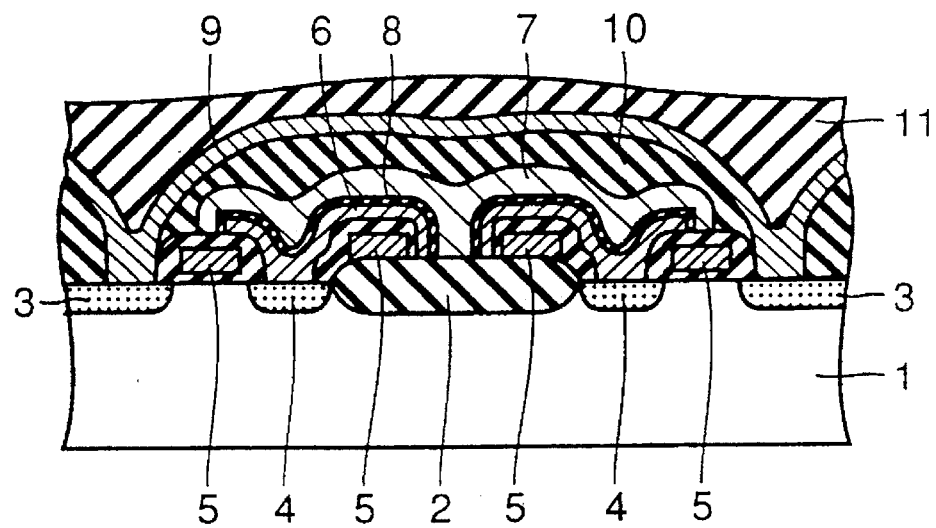
FIG. 20 is a cross section taken along the line A—A of FIG. 19 showing the conventional DRAM.
Figure 21:
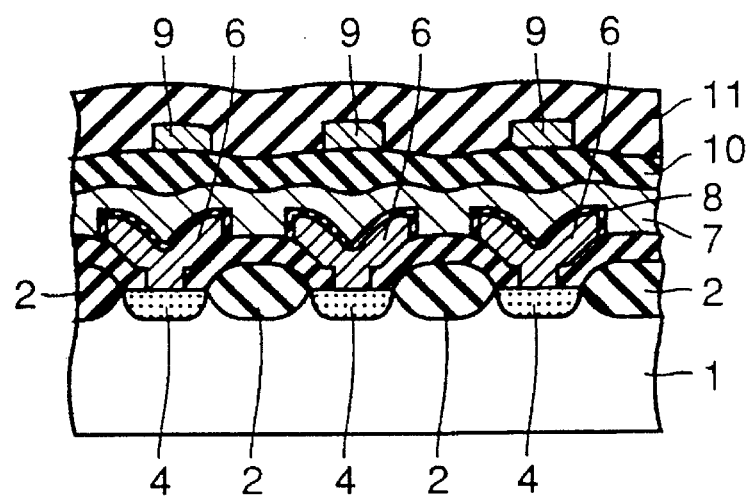
FIG. 21 is a cross section taken along the line B—B of FIG. 19 showing the conventional DRAM.
Figure 22:
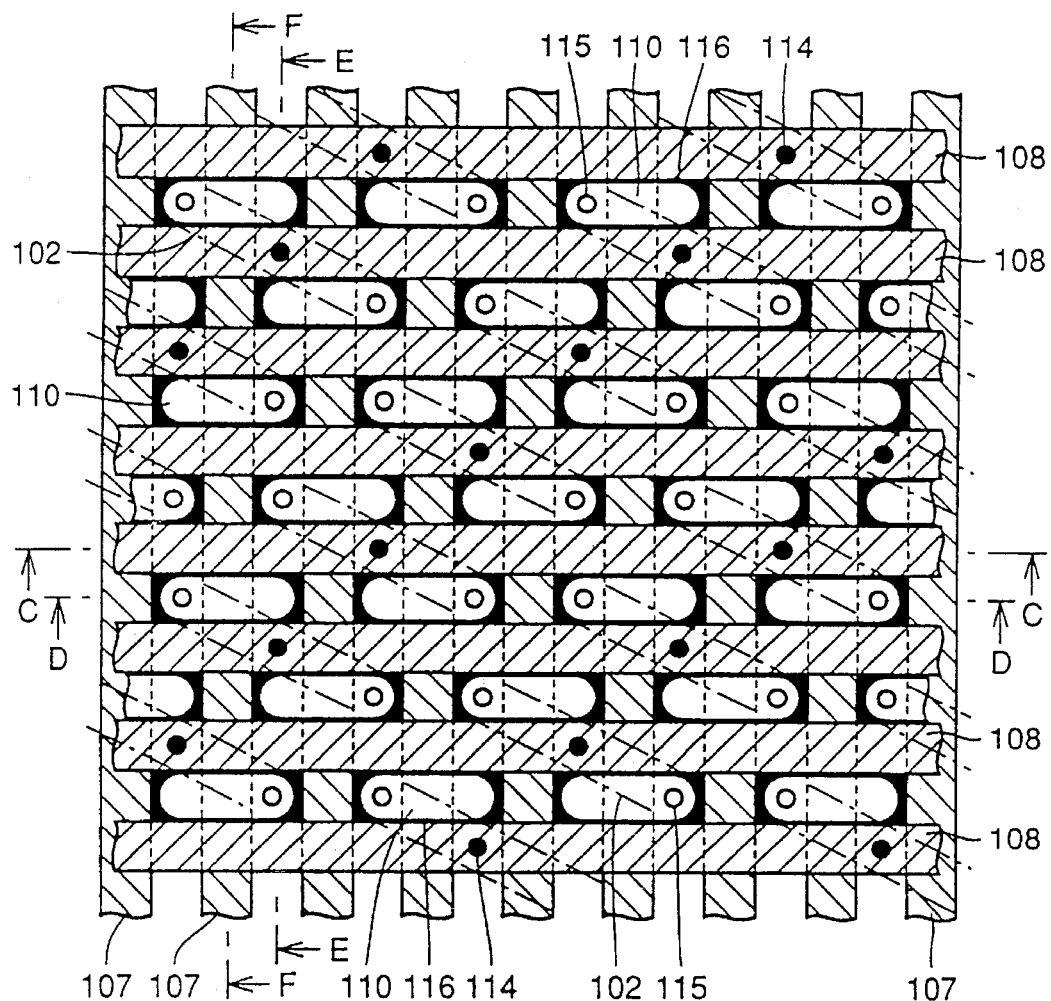
FIG. 22 is a plan view showing the DRAM, with the storage node 110 placed on the uppermost portion.
Figure 23:
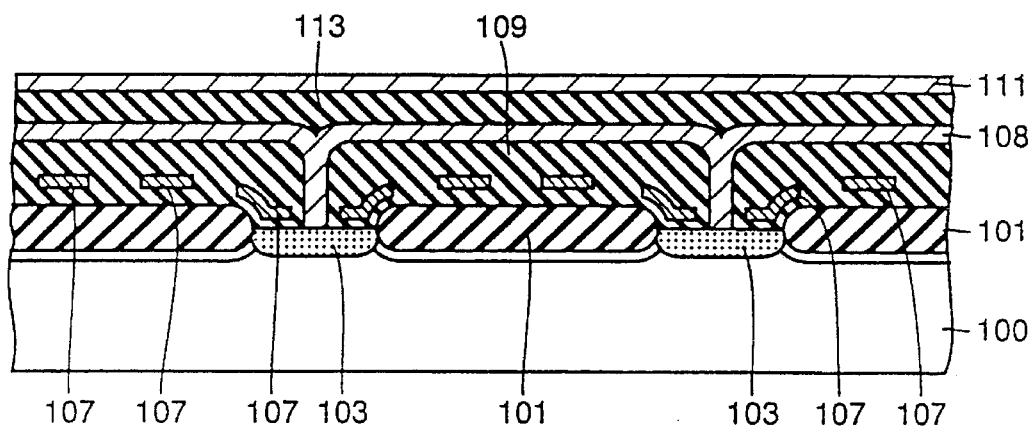
FIG. 23 is a cross section taken along the line C—C of FIG. 22 showing the DRAM.
Figure 24:
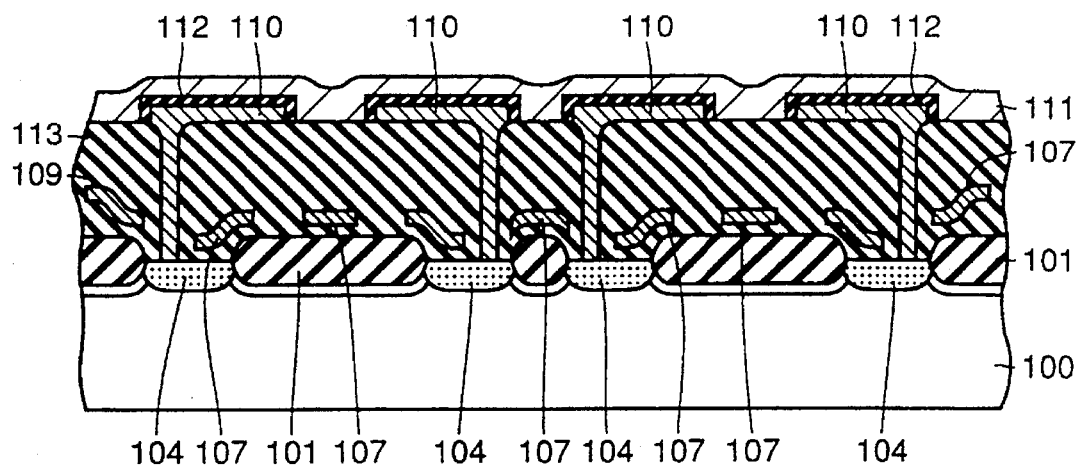
FIG. 24 is a cross section taken along the line D—D of FIG. 22 showing the DRAM.
Figure 25:
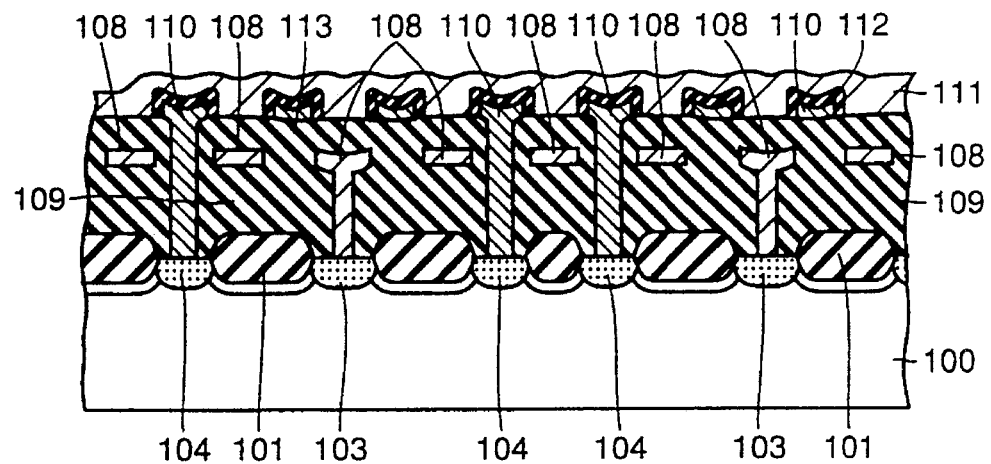
FIG. 25 is a cross section taken along the line E—E of FIG. 22 showing the DRAM.
Figure 26:
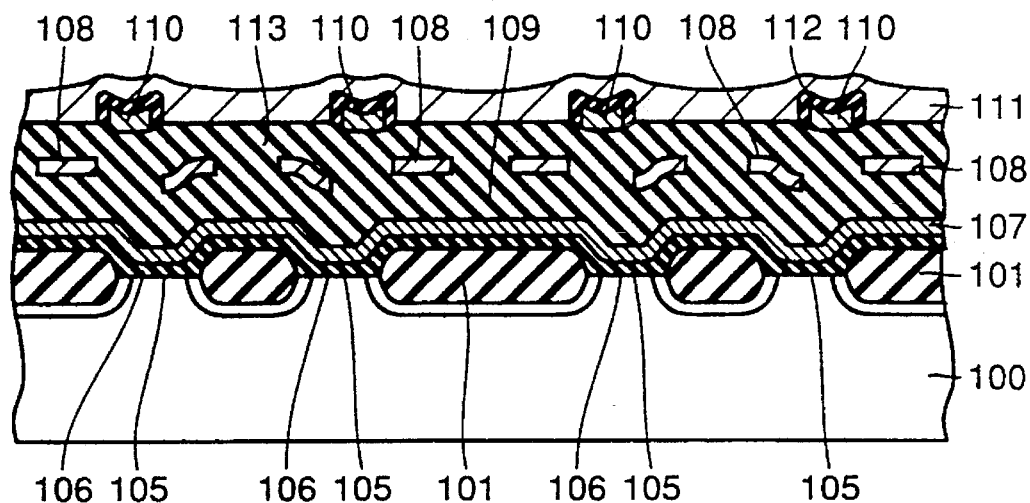
FIG. 26 is a cross section taken along the line F—F of FIG. 22 showing the DRAM.

FIG. 14 shows the fourth embodiment of the present invention. As compared with the first embodiment, in the fourth embodiment, the capacitance value is increased by making rough the surface 110*a* of storage node 110. Except this point, this embodiment is the same as the first embodiment.

The rough surface 110 of storage node 110 is formed by the method disclosed, for example, in *Japanese Journal of Applied Physics* Vol. 29, No. 12, December, 1990, pp. L2345–L2348. By the rough surface 110*a* of storage node 110 obtained by this method, the surface area of storage node 110 could be increased to 1.5 to 2 times that of the first embodiment.

Fifth Embodiment

FIGS. 15 to 18 shows the fifth embodiment of the present invention. As compared with the second embodiment described above, in the fifth embodiment, storage node 110 additionally has a cylindrical portion 110*b* extending in the vertical direction with respect to one major surface of semiconductor substrate 100. Except this point, it is the same as the second embodiment.

A standing wall positioned at the shorter side portion of the cylindrical portion 110b of storage node 100 is on the bit line 108 adjacent to that bit line 108 which is connected to the corresponding memory cell, that is, provided directly above the bit line 108.

The cylindrical portion 110b of storage node 110 is formed by the method disclosed, for example, in *MITSUBISHI ELECTRIC TECHNICAL REPORT*, Vol. 63, No. 11, 1989, pp. 17–22.

The fifth embodiment structured as described above provides the same effect as the second embodiment, and in addition, the capacitance value of the capacitive element of the memory cell can further be increased.

In the first to fifth embodiments above, an upper interconnection may be provided parallel to the word lines 107 on the cell plate 110 with an interlayer insulating layer interposed, and the upper interconnection may be electrically connected to the word line 107, so as to reduce resistance of word lines 107.

As described above, the present invention is suitable for higher degree of integration and larger storage capacity, and even when the degree of integration and storage capacity are increased, dimension loss of the storage node of capacitive element of the memory cell from the design can be suppressed and desired capacitance value can be ensured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory cells formed on a major surface of a semiconductor substrate, each having one transistor element and one capacitive element;
   a plurality of word lines formed by a first conductive layer on the major surface of said semiconductor substrate with an insulating layer therebetween, arranged parallel to each other and electrically connected to gate electrodes of transistor elements of corresponding said plurality of memory cells; and
   a plurality of bit lines formed by a second conductive layer positioned above said first conductive layer on the major surface of said semiconductor substrate, arranged parallel to each other and crossing said word lines, and electrically connected to one of source/drain regions of transistor elements of corresponding said plurality of memory cells; wherein
   a storage node constituting one electrode of the capacitive element of each said memory cell is formed by a third conductive layer positioned above said second conductive layer on the major surface of said semiconductor substrate, electrically connected to the other one of the source/drain regions of the transistor element of the corresponding memory cell, and arranged between adjacent two word lines and crossing over a bit line, with a longer side being parallel to the word lines and a shorter side being parallel to the bit lines.

2. The semiconductor memory device according to claim 1, wherein
   said storage node constituting one electrode of the capacitive element of each said memory cell has its shorter side portion extending on a bit line adjacent to that bit line which is connected to the corresponding memory cell.

3. The semiconductor memory device according to claim 1, further comprising
   an element isolating conductive layer formed by a fourth conductive layer positioned below said first conductive layer on the major surface of said semiconductor substrate, surrounding an element forming region on the semiconductor substrate for forming the transistor element of said memory cell, to which a prescribed potential is applied.

4. The semiconductor memory device according to claim 1, wherein
   said storage node constituting one electrode of the capacitive element of each said memory cell has a rough upper surface.

5. A semiconductor memory device according to claim 1, wherein
   said storage node constituting one electrode of the capacitive element of each said memory cell has a cylindrical portion extending vertical to the major surface of the semiconductor substrate.

6. A semiconductor memory device, comprising:
   a plurality of memory cells formed on a major surface of a semiconductor substrate, each including one transistor element and one capacitive element;
   a plurality of word lines formed by a first conductive layer on the major surface of said semiconductor substrate with an insulating layer therebetween, arranged parallel to each other and electrically connected to gate electrodes of transistor elements of corresponding said plurality of memory cells; and
   a plurality of bit lines formed by a second conductive layer positioned above said first conductive layer on the major surface of said semiconductor substrate, arranged parallel to each other and orthogonal to said word lines, and electrically connected to one of source/drain regions of transistor elements of corresponding said plurality of memory cells; wherein
   a storage node constituting one electrode of the capacitive element of each said memory cell is formed by a third conductive layer positioned above said second conductive layer on the major surface of said semiconductor substrate, electrically connected to the other one of the source/drain regions of the transistor element of the corresponding memory cell, and arranged between a word line to which the corresponding memory cell is connected and another word line adjacent to said word line on the side of the other one of the source/drain regions of the transistor element of the corresponding memory cell and crossing over a bit line to which the corresponding memory cell is connected.

7. A dynamic random access memory, comprising:
   a plurality of memory cells formed on a major surface of a semiconductor substrate, each having one field effect transistor and one capacitor;
   a plurality of word lines formed by a first conductive layer on the main surface of said semiconductor substrate with an insulating layer therebetween and arranged parallel to each other; and
   a plurality of bit lines formed by a second conductive layer positioned above said first conductive layer on the major surface of said semiconductor substrate, arranged parallel to each other and orthogonal to said word lines; wherein said field effect transistor includes first and second impurity regions formed on the major surface of said semiconductor substrate, and a gate electrode formed on a channel regions sandwiched between said first and second impurity regions with a gate insulating film interposed;

said capacitor includes a storage node formed by a third conductive layer positioned above said second conductive layer on the major surface of said semiconductor substrate, and a cell plate arranged on and opposing to a surface of said storage node with a dielectric film interposed;

said gate electrode being electrically connected to said word line, said first impurity region being electrically connected to said bit line, said second impurity region being electrically connected to said storage node, said storage node being formed to have a rectangular shape having longer and shorter sides, the longer side being arranged parallel to said word line and the shorter side being arranged parallel to said bit lines, and said storage node being arranged crossing over said bit line.

* * * * *